US010665642B2

(12) United States Patent
Odaka et al.

(10) Patent No.: US 10,665,642 B2
(45) Date of Patent: May 26, 2020

(54) DISPLAY DEVICE AND METHOD FOR MANUFACTURING THE SAME

(71) Applicant: Japan Display Inc., Tokyo (JP)

(72) Inventors: Kazuhiro Odaka, Tokyo (JP); Jun Hanari, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/128,613

(22) Filed: Sep. 12, 2018

(65) Prior Publication Data

US 2019/0096964 A1   Mar. 28, 2019

(30) Foreign Application Priority Data

Sep. 27, 2017   (JP) .................................. 2017-186622

(51) Int. Cl.
*H01L 27/32* (2006.01)
*H01L 51/00* (2006.01)
*H01L 51/56* (2006.01)
*H01L 51/52* (2006.01)

(52) U.S. Cl.
CPC ........ *H01L 27/3223* (2013.01); *H01L 51/003* (2013.01); *H01L 51/56* (2013.01); *H01L 27/3244* (2013.01); *H01L 51/0097* (2013.01); *H01L 51/5246* (2013.01); *H01L 2227/326* (2013.01); *H01L 2251/5338* (2013.01); *H01L 2251/566* (2013.01)

(58) Field of Classification Search
CPC ......... H01L 23/544; H01L 2223/54426; B81C 99/007
See application file for complete search history.

(56) References Cited

U.S. PATENT DOCUMENTS

| 6,018,332 A * | 1/2000 | Nason ....................... G06F 3/14 345/661 |
| 2004/0041158 A1* | 3/2004 | Hongo ................ H01L 21/2026 257/79 |
| 2004/0235279 A1* | 11/2004 | Kim .................. H01L 21/02532 438/488 |
| 2005/0012228 A1* | 1/2005 | Hiramatsu ........ H01L 21/02422 257/797 |
| 2005/0167471 A1* | 8/2005 | Enokido .............. B23K 20/004 228/103 |
| 2009/0001617 A1* | 1/2009 | Chang ................... H01L 23/544 257/797 |
| 2011/0294244 A1 | 12/2011 | Hattori et al. |
| 2017/0243759 A1* | 8/2017 | Jintyou ............... H01L 21/0214 |
| 2019/0072790 A1* | 3/2019 | Maeda .................. G02F 1/1333 |

(Continued)

FOREIGN PATENT DOCUMENTS

JP   2011-248072 A   12/2011

*Primary Examiner* — Didarul A Mazumder
(74) *Attorney, Agent, or Firm* — Michael Best & Friedrich LLP

(57) ABSTRACT

A display device includes a substrate; a display portion located on the substrate, the display portion including a plurality of pixels; a first marker located in an end area that is along a longer side of the substrate and is in at least one of four corner areas of the substrate, the first marker extending in a longer axis direction of the substrate; and a second marker located in an end area that is along a shorter side of the substrate and is in the same corner area as that of the first marker, the second marker extending in a shorter axis direction of the substrate.

7 Claims, 20 Drawing Sheets

(56) References Cited

U.S. PATENT DOCUMENTS

| | | | |
|---|---|---|---|
| 2019/0157501 A1* | 5/2019 | An | H01L 21/6835 |
| 2019/0214348 A1* | 7/2019 | Liu | H01L 21/78 |
| 2019/0252270 A1* | 8/2019 | Hoo | G03F 7/20 |
| 2019/0259973 A1* | 8/2019 | Shin | H01L 23/544 |

* cited by examiner

DISPLAY DEVICE AND METHOD FOR MANUFACTURING THE SAME

CROSS REFERENCE TO RELATED APPLICATIONS

This application is based upon and claims the benefit of priority from the prior Japanese Patent Application No. 2017-186622, filed on Sep. 27, 2017, the entire contents of which are incorporated herein by reference.

FIELD

An embodiment according to the present invention relates to a display device including a foldable flexible substrate and a method for manufacturing the same.

BACKGROUND

As display devices usable for electric appliances and electronic devices, liquid crystal display devices utilizing an electro-optical effect of liquid crystal materials and organic EL (Electro-Luminescence) display devices using organic EL elements have been developed and provided as practically usable devices.

A display device including, especially, an organic EL element as a display element provides a wide viewing angle and highly precise display. An organic EL display device may be manufactured on a flexible substrate. In the case where an organic EL display device is to be manufactured on a flexible substrate, a support substrate is widely used. Japanese Laid-Open Patent Publication No. 2011-248072 discloses a method for manufacturing an organic EL display device using a support substrate. The support substrate supports a flexible substrate, and thus defects are suppressed in a process of manufacturing the organic EL display device.

When being peeled off from the support substrate, the flexible substrate may possibly be expanded or shrunk. If such expansion or shrinkage causes the size of the pre-cutting flexible substrate to be changed, the size of the post-cutting flexible substrate is also changed. When this occurs, it may be difficult to stably continue the manufacturing of the organic EL display device after this step.

In light of such a problem, one of objects of the present invention is to provide a display device having a stable size of flexible substrate and a method for manufacturing the same.

SUMMARY

An embodiment of the present invention provides a display device including a substrate; a display portion located on the substrate, the display portion including a plurality of pixels; a first marker located in an end area that is along a longer side of the substrate and is in at least one of four corner areas of the substrate, the first marker extending in a longer axis direction of the substrate; and a second marker located in an end area that is along a shorter side of the substrate and is in the same corner area as that of the first marker, the second marker extending in a shorter axis direction of the substrate.

Another embodiment of the present invention provides a method for manufacturing a display device. The method includes forming a substrate on a support member; forming a display portion and a peripheral portion on the substrate; forming a first marker in a first corner area of one side of the substrate; forming a second marker in a second corner area of the one side of the substrate; acquiring a first central line of the first marker; acquiring a first central line of the second marker; peeling off the support member from the substrate; acquiring a second central line of the first marker; acquiring a second central line of the second marker; acquiring a first cutting line based on a first difference between the first central line of the first marker and the second central line of the first marker; acquiring a second cutting line based on a second difference between the first central line of the second marker and the second central line of the second marker; and cutting the substrate based on the first cutting line and the second cutting line.

DESCRIPTION OF EMBODIMENTS

Figure 1:
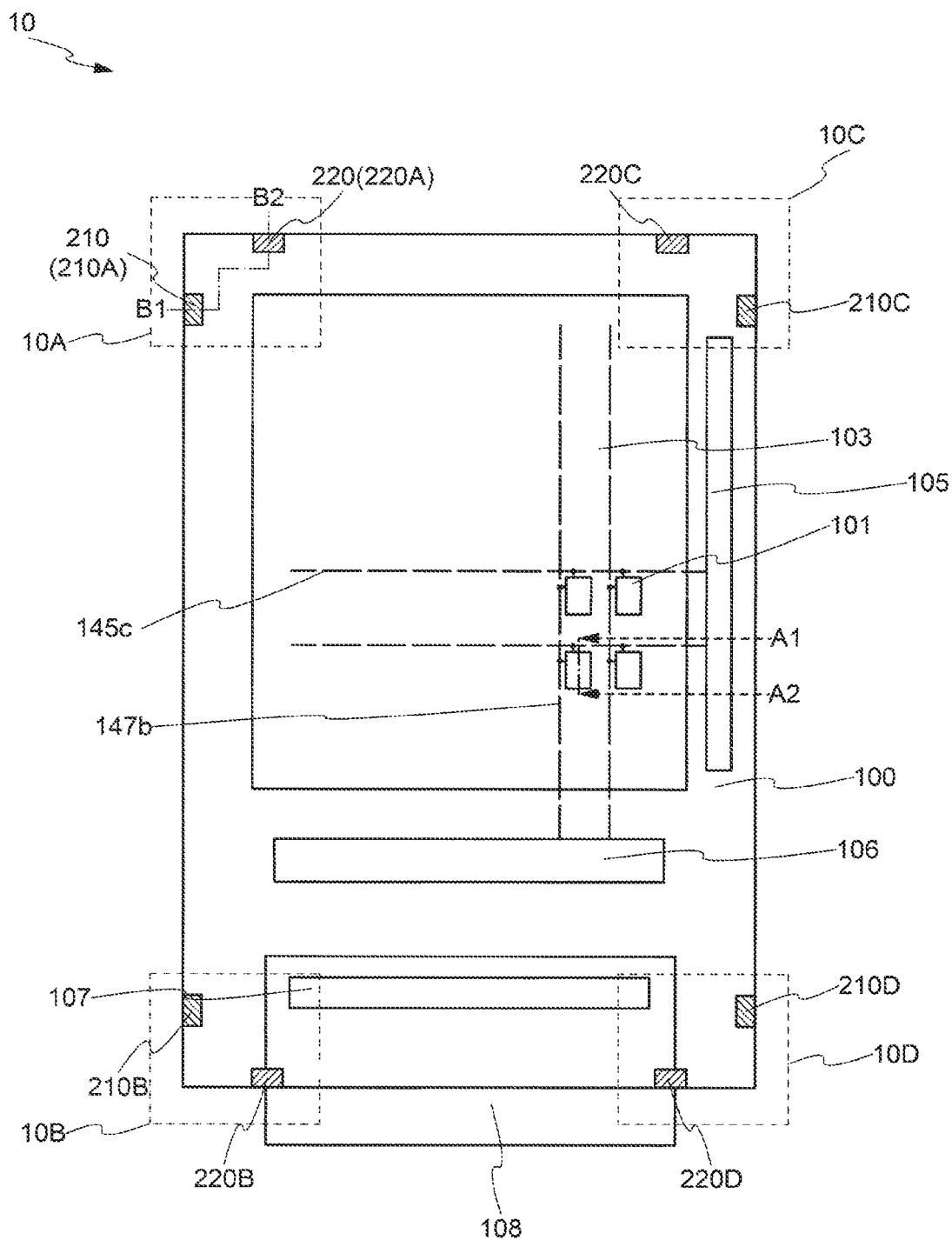
FIG. 1 is a plan view of a display device in an embodiment according to the present invention.

Hereinafter, embodiments according to the present invention will be described with reference to the drawings. This disclosure merely provides an example, and modifications or alterations thereof readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clearer illustration. The drawings are merely examples and do not limit the interpretations of the present invention in any way.

In the specification and the drawings, components that have substantially the same functions as those described before with reference to a previous drawing(s) bear the identical reference signs thereto, and detailed descriptions thereof may be omitted. The words "first", "second" and the like provided for components are used merely to distinguish the components from each other, and do not have any further meaning unless otherwise specified.

In the specification and the claims, regarding the positional relationship between two components, an expression that one component or region is "on" the other component or region encompasses a case where the one component or region is in direct contact with the other component or region and also a case where the one component is above or below the other component or region, namely, a case where another component or region is provided between the one component or region and the other component or region, unless otherwise specified. In the following description, unless otherwise specified, the side on which a display element is provided with respect to a substrate as seen in a cross-sectional view will be referred to as "above", and the opposite side will be referred to as "below". In the following description, unless otherwise specified, the terms "first", "second" and the like are used merely to distinguish similar types of components and do not have any further significance. The "first marker" in the embodiments and the "first marker" in the claims do not necessarily refer to exactly the same component. The "second marker" in the embodiments and the "second marker" in the claims do not necessarily refer to exactly the same component.

Embodiment 1

(1-1. Structure of the Display Device)

FIG. 1 is a plan view of a display device 10 in an embodiment according to the present invention. As shown in FIG. 1, the display device 10 includes a substrate 100, a display portion 103, a driving circuit 105, a driving circuit 106, a terminal electrode 107, and a flexible printed circuit board 108.

The display portion 103 includes a plurality of pixels 101 located in a lattice while being out of contact with each other. The pixels 101 each act as an element of an image. Scanning lines 145c are connected with the driving circuit 105. Signal lines 147b are connected with the driving circuit 106. The pixels 101 are connected with the scanning lines 145c and the signal lines 147b.

The driving circuit 105 has a function of a gate driver driving the scanning lines 145c. The driving circuit 106 has a function of a source driver driving the signal lines 147b. The driving circuit 105 and the driving circuit 106 are each formed of an integrated circuit such as an ASIC (Application Specific Integrated Circuit) or the like. The driving circuit 106 may be located on the flexible printed circuit board 108.

The display device 10 operates as follows. A video signal is input to the driving circuit 106 via the flexible printed circuit board 108. Next, the driving circuit 105 and the driving circuit 106 drive display elements 130 (see FIG. 5; described below) in certain pixels 101 via the corresponding scanning lines 145c and the corresponding signal lines 147b. As a result, a still image or a moving image is displayed in the display portion 103.

The display device 10 has a rectangular shape and thus has four corner areas. In each of the four corner areas, the display device 10 includes a first marker 210 along a longer side, and also includes a second marker 220 along a shorter side. For example, a first marker 210A and a second marker 220A are located in an upper left corner area 10A. A first marker 210B and a second marker 220B are located in a lower left corner area 10B. A first marker 210C and a second marker 220C are located in an upper right corner area 100. A first marker 210D and a second marker 220D are located in a lower right corner area 10D. In the case where the first markers do not need to be distinguished from each other, the first markers may be referred to as the "first markers 210". In the case where the second markers do not need to be distinguished from each other, the second markers may be referred to as the "second markers 220".

(1-2. Structure of the Corner Areas of the Display Device)

Now, a structure of the corner areas of the display device 10 will be described with reference to the drawings.

Figure 2:
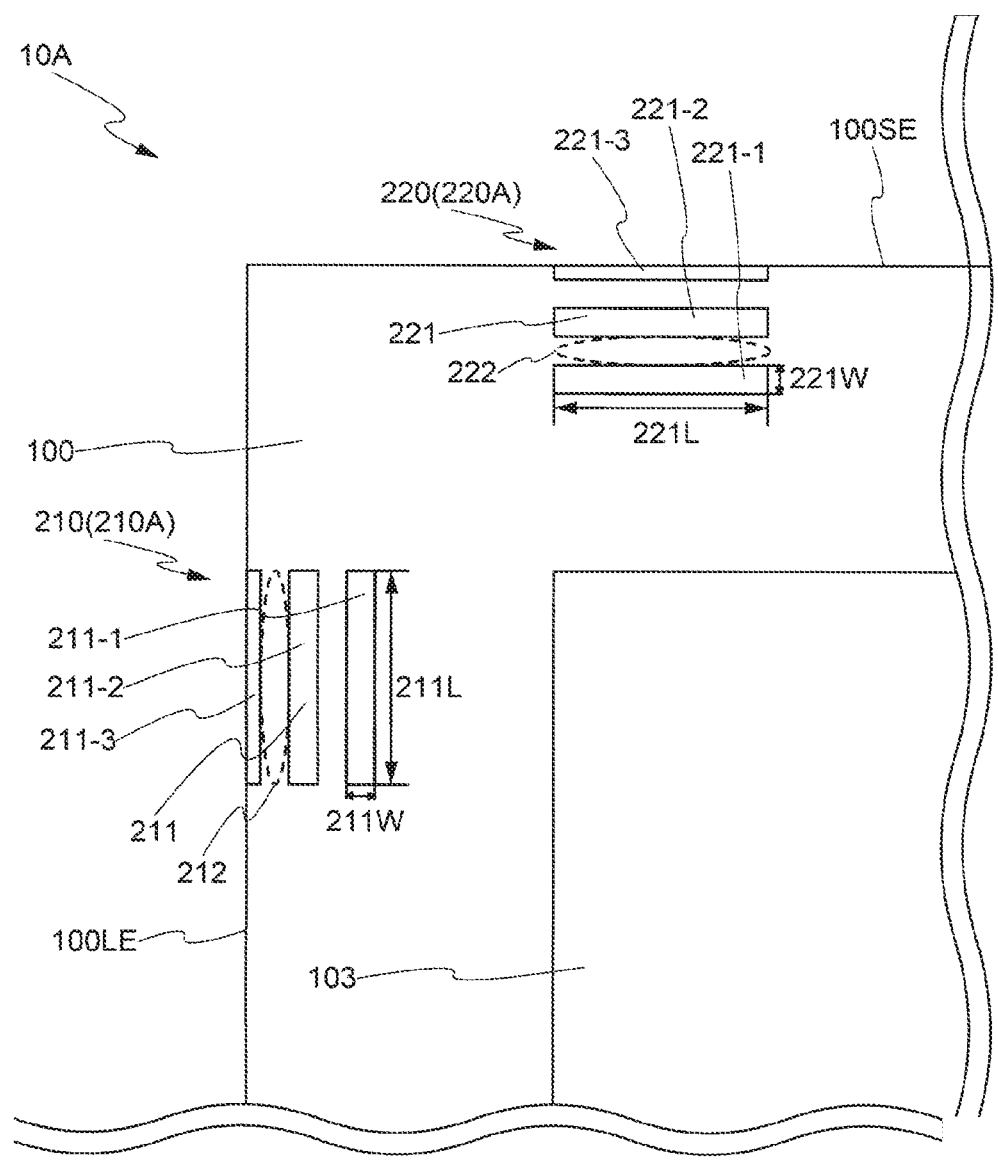
FIG. 2 is a partially enlarged plan view of the display device in an embodiment according to the present invention.
Figure 3A:
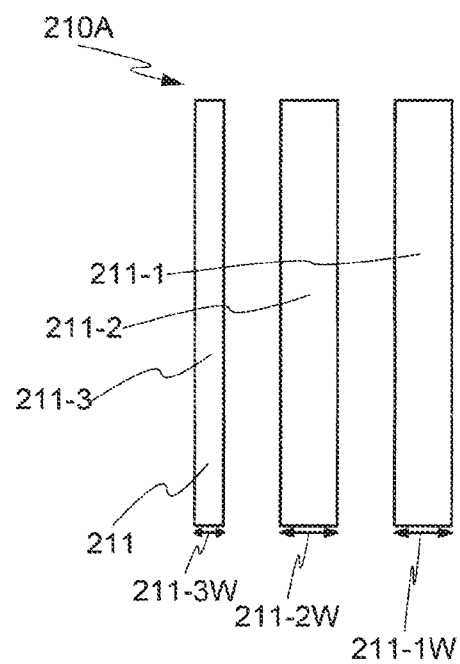
FIG. 3A is a plan view of a first marker in the display device in an embodiment according to the present invention.
Figure 3B:
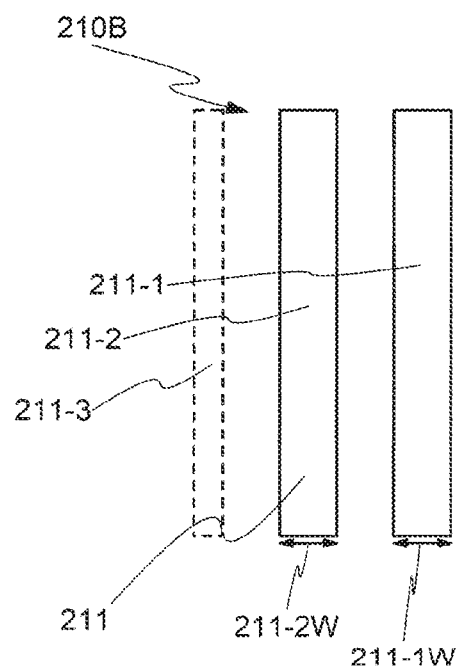
FIG. 3B is a plan view of another first marker in the display device in an embodiment according to the present invention.

FIG. 2 is an enlarged plan view of the upper left corner area 10A among the four corner areas of the substrate 100. FIG. 3A is an enlarged plan view of the first marker 210A in the upper left corner area 10A. FIG. 3B is an enlarged plan view of the first marker 210B in the lower left corner area 10B.

The first marker 210 (e.g., the first marker 210A) includes a plurality of lines 211 and spaces 212 provided between the plurality of lines 211. The first marker 210 is located in contact with an edge 100LE at the longer side of the substrate 100. The first marker 210 is located as extending in a longer axis direction.

The lines 211 each have a length 211L and a width 211W. In each of the first markers 210, the length 211L is the same among the plurality of lines 211, but the width 211W may be different among the plurality of lines 211. For example, as shown in FIG. 2 and FIG. 3A, among the lines 211, a line 211-1 has a width 211-1W, and a line 211-2 has a width 211-2W. The width 211-1W and the width 211-2W are equal to each other. By contrast, a line 211-3 has a width 211-3W, which is narrower than the width 211-1W of the line 211-1.

The first markers 210 may have different shapes in the four corner areas of the substrate 100. For example, as shown in FIG. 3A and FIG. 3B, the first marker 210A in the upper left corner area 10A and the first marker 210B in the lower left corner area 10B have different shapes from each other. Specifically, the first marker 210A includes the line 211-3, whereas the first marker 210B does not include the line 211-3.

The second marker 220 (e.g., the second marker 220A) includes a plurality of lines 221 and spaces 222 provided between the plurality of lines 221. The second marker 222 is provided in contact with an edge 100SE at the shorter side of the substrate 100. The second marker is located as extending in a shorter axis direction.

Figure 4A:
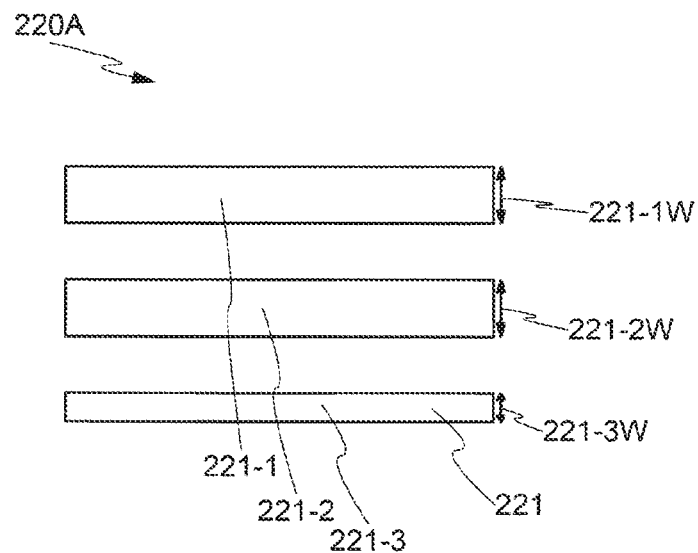
FIG. 4A is a plan view of a second marker in the display device in an embodiment according to the present invention.

The lines 221 has a length 221L and a width 221W. In each of the second markers 220, the length 221L is the same among the plurality of lines 221, but the width 221W may be different among the plurality of lines 221. For example, as shown in FIG. 2 and FIG. 4A, among the lines 221, a line 221-1 has a width 221-1W, and a line 221-2 has a width 221-2W. The width 221-1W and the width 221-2W are equal to each other. By contrast, a line 221-3 has a width 221-3W, which is narrower than the width 221-1W of the line 221-1.

Figure 4B:
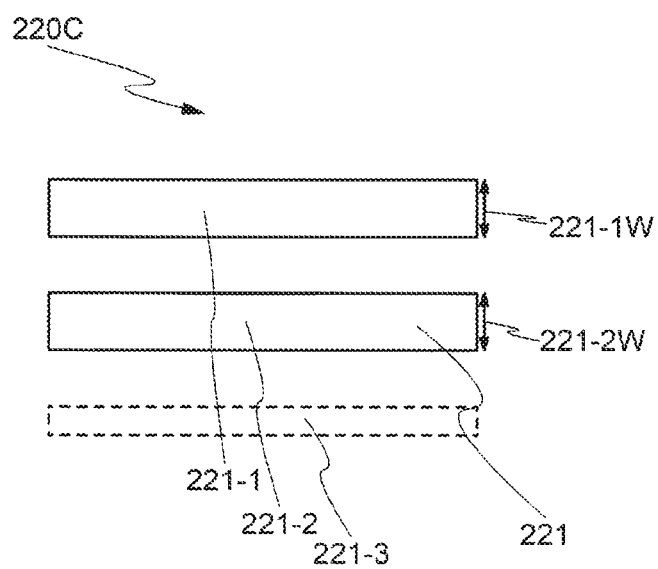
FIG. 4B is a plan view of another second marker in the display device in an embodiment according to the present invention.

The second markers 220 may have different shapes in the four corner areas of the substrate 100. For example, as shown in FIG. 4A and FIG. 4B, the second marker 220A in the upper left corner area 10A and the second marker 220C in the upper right corner area 100 have different shapes from each other. Specifically, the second marker 220A includes the line 221-3, whereas the second marker 220C does not include the line 221-3.

(1-3. Structure of Layers of the Display Device)

Figure 5:
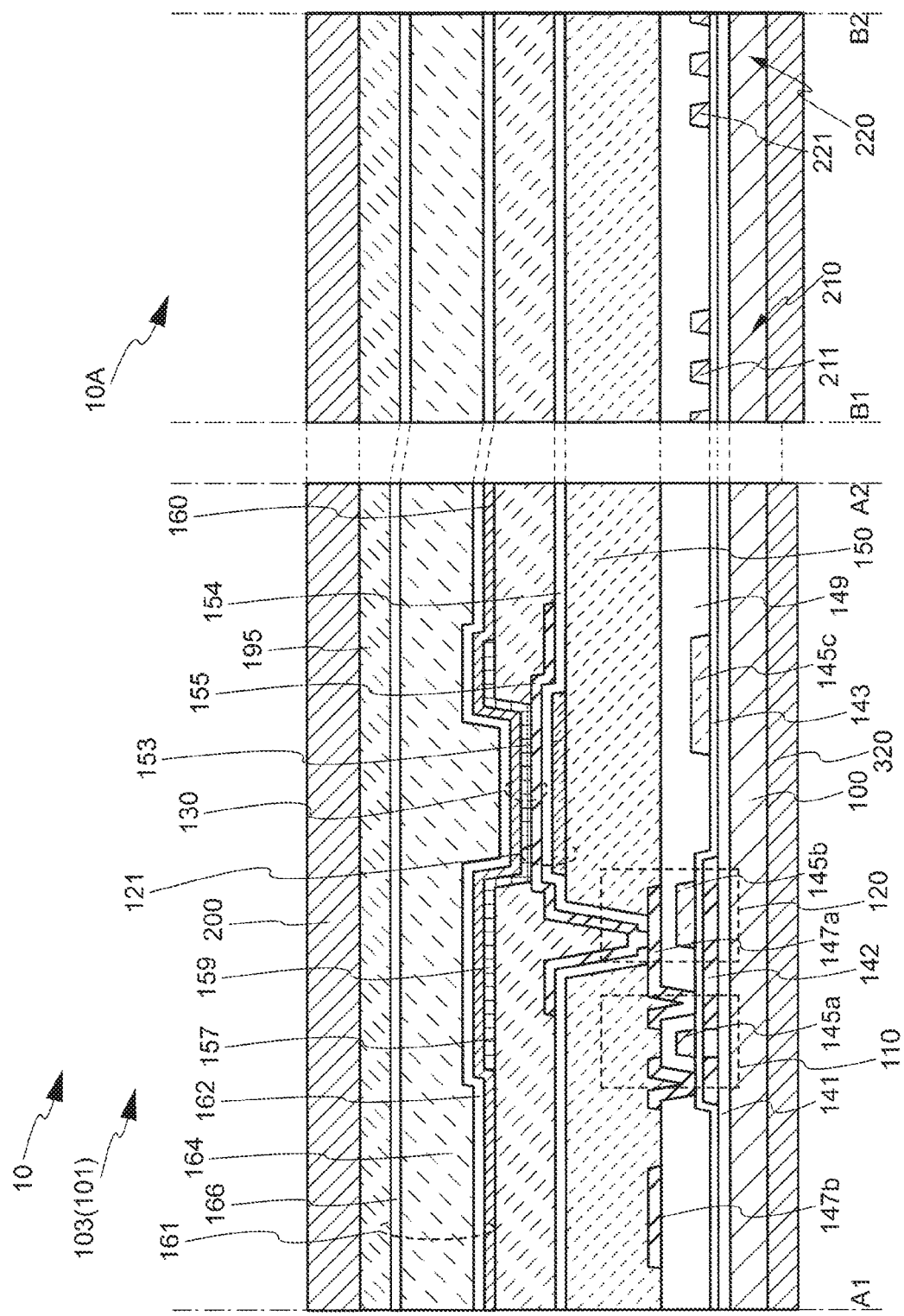
FIG. 5 is a cross-sectional view of the display device in an embodiment according to the present invention.

Now, a structure of each of components of the display device 10 will be described. FIG. 5 is a cross-sectional view of the display device 10 shown in FIG. 1. More specifically, FIG. 5 shows a cross-sectional view of the display portion 103 (the pixel 101 taken along line A1-A2 in FIG. 1) and a cross-sectional view of the upper left corner area 10A taken along line B1-B2 in FIG. 1.

The display device 10 includes, in the display portion 103 (between line A1-A2), the substrate 100, an insulating layer 141, a transistor 110, a capacitor 120, a capacitor 121, the display element 130, an insulating layer 149, a flattening layer 150, a sealing layer 161, an adhesive layer 195, and a substrate 200.

The substrate 100 and the substrate 200 are each formed of a flexible organic resin substrate. The organic resin substrate is, for example, a polyimide substrate. The organic resin substrate may have a thickness of several micrometers to several ten micrometers, and thus may realize a flexible sheet display. The substrate 100 and the substrate 200 need to be transparent in order to allow light, emitted from a light emitting element (described below), to be output outside. One of the substrate 100 and the substrate 200 through which the light emitted from the light emitting element is not output outside does not need to be transparent, and therefore, may be a substrate including a metal substrate and an insulating layer provided on the metal substrate, instead of being a substrate formed of the above-described material.

The substrate 100 and the substrate 200 may each be provided with a protective member on a second surface (outer surface as seen in a cross-sectional view). In FIG. 5, a protective member 320 is provided on the second surface of the substrate 100. Such a protective member may be formed of a metal material or an organic resin as long as being a film. The protective member prevents the display device 10 from being scratched or chipped off. The substrate 200 has a role of protecting the light emitting element (described below), but may not be necessary in the case where the light emitting element is sufficiently protected by the sealing layer 161.

The transistor 110 includes a semiconductor layer 142, a gate insulating layer 143, a gate electrode 145a, and source and drain electrodes 147a. The transistor 110 has a top-gate/top-contact structure in this example. The transistor 110 is not limited to having such a structure, and may have a bottom-gate/bottom-contact structure.

The capacitor 120 includes the gate insulating layer 143 as a dielectric element, and also includes a source or drain region of the semiconductor layer 142 and a capacitor electrode 145b. The capacitor 121 includes an insulating layer 154 as a dielectric layer, and also includes a conductive layer 153 and a pixel electrode 155.

The display element 130 includes the pixel electrode 155, an organic EL layer 159 and a counter electrode 160. Namely, the display element 130 is considered as being an organic EL element. The display element 130 has a so-called top-emission structure; more specifically, allows light emitted by the organic EL layer 159 to be output toward the counter electrode 160. The display element 130 is not limited to having the top-emission structure, and may have a bottom-emission structure.

The flattening layer 150 has a function of a flattening film, and is provided on the insulating layer 149 and the source and drain electrodes 147a. A rib 157 covers a peripheral region of the pixel electrode 155, which is a part of the display element 130. The flattening layer 150 and the rib 157 contains an organic resin.

The sealing layer 161 has a function of preventing moisture from entering the display element 130 from outside of the display device 10. In the display portion 103 including the pixels 101, the sealing layer 161 includes an inorganic insulating layer 162, an organic insulating layer 164 and an inorganic insulating layer 166 stacked in this order. The inorganic insulating layer 162 may be in contact with the insulating layer 154 containing an inorganic material.

In the upper left corner area 10A, the display device 10 includes the substrate 100, the flattening layer 150, the sealing layer 161, the adhesive layer 195, the substrate 200, and also the first marker 210 and the second marker 220.

In this example, the first marker 210 and the second marker 220 are provided in a layer including the gate electrode 145a, the capacitor electrode 145b and the scanning line 145c. Namely, the first marker 210 and the second marker 220 are located in a layer including any of the lines of the display portion 103.

There is no specific limitation on the material of the lines 211 of the first marker 210 or the lines 221 of the second marker 220. It is desired that the lines 211 of the first marker 210 and the lines 221 of the second marker 220 are formed of a light-reflective material. In this case, the gate electrode 145a, the capacitor electrode 145b and the scanning line 145c located in the layer including the first marker 210 and the second marker 220 are formed of a light-reflective conductive material selected from tantalum, tungsten, titanium, molybdenum, aluminum and the like. The gate electrode 145a and the capacitor electrode 145b may each have a single-layer structure formed of any of the above-listed conductive materials, or may each have a stack structure formed of such conductive materials.

(1-4. Method for Manufacturing the Display Device)

Now, with reference to FIG. 6 to FIG. 14, a method for manufacturing the display device 10 will be described. For the sake of convenience, a part of components may be omitted in the description.

Figure 6:
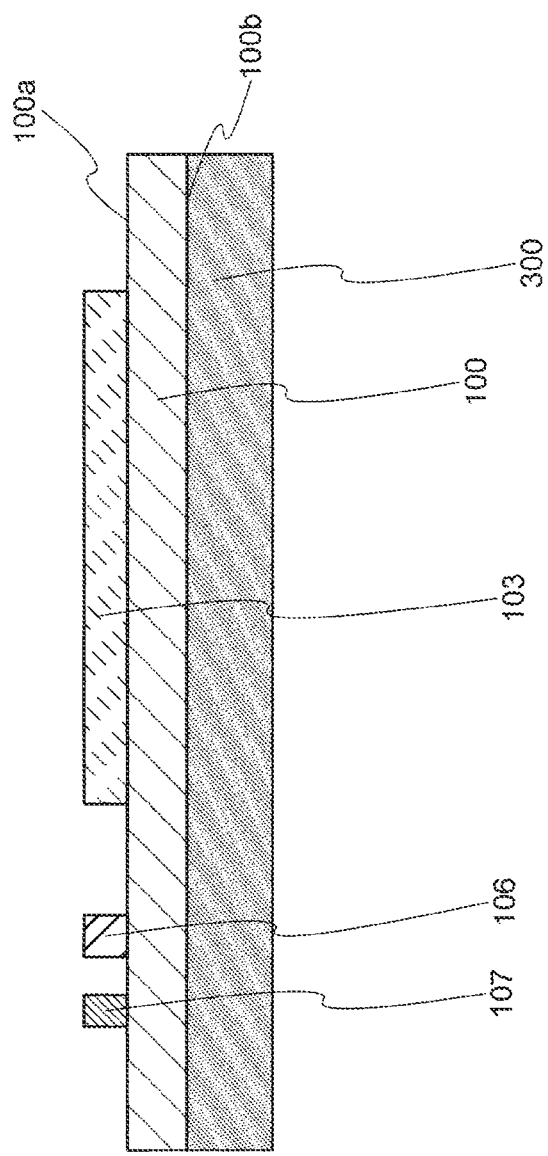
FIG. 6 is a cross-sectional view showing a method for manufacturing the display device in an embodiment according to the present invention.
Figure 7:
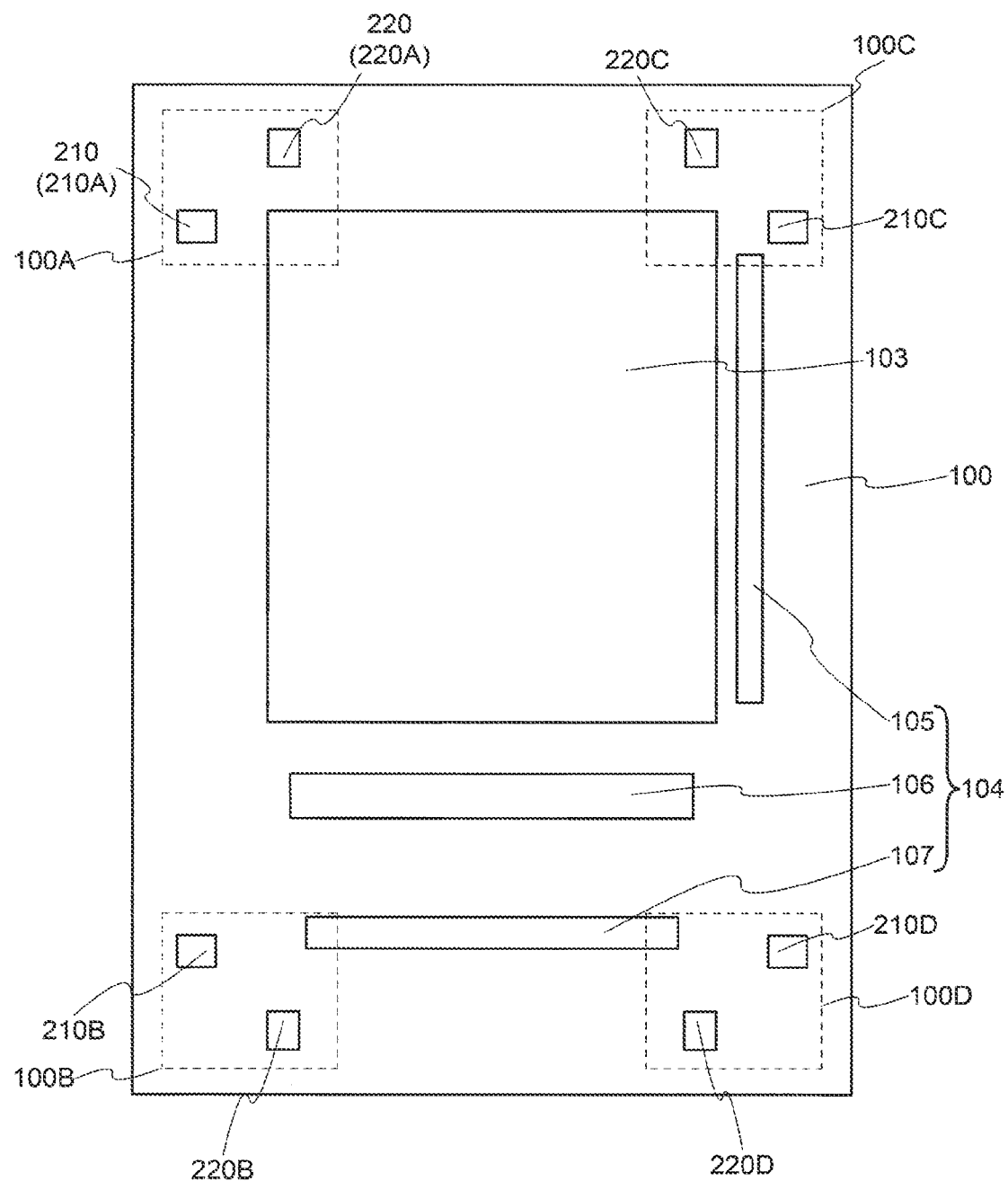
FIG. 7 is a plan view showing the method for manufacturing the display device in an embodiment according to the present invention.

As shown in FIG. 6 and FIG. 7, first, the substrate 100 is formed on a support member 300. Next, the display portion 103, the driving circuit 105, the driving circuit 106, the terminal electrode 107, the first markers 210 and the second markers 220, which form a part of the display device 10, are formed on a first surface 100a of the substrate 100. The driving circuit 105, the driving circuit 106 and the terminal electrode 107 are provided around the display portion 103, and thus may be referred to collectively as a "peripheral portion 104".

As the substrate 100, a flexible organic resin substrate is used. As the organic resin substrate, a polyimide substrate, for example, is used. The support member 300 is formed of a rigid material. There is not specific limitation on the thickness of the support member 300 as long as the support member 300 is sufficiently thick to be rigid, and the thickness of the support member 300 is appropriately set in the range of 200 µm or greater and 2 mm or less. For example, a glass substrate having a thickness of 1 mm is used as the support member 300. Use of the support member 300 keeps the substrate 100 flat. This may allow the display portion 103 and the like to be formed on the substrate 100 stably.

The first markers 210 are formed in areas that are along the longer sides and are in the four corner areas of the substrate 100. The first marker 210A is formed in an upper left corner area 100A. The first marker 210B is formed in a lower left corner area 100B. The first marker 210C is formed in an upper right corner area 100C. The first marker 210D is formed in a lower right corner area 100D.

The second markers 220 are formed in areas that are along the shorter sides and are in the four corner areas of the substrate 100. The second marker 220A is formed in the upper left corner area 100A. The second marker 220B is formed in the lower left corner area 100B. The second marker 220C is formed in the upper right corner area 100C. The second marker 220D is formed in the lower right corner area 100D.

Figure 8:
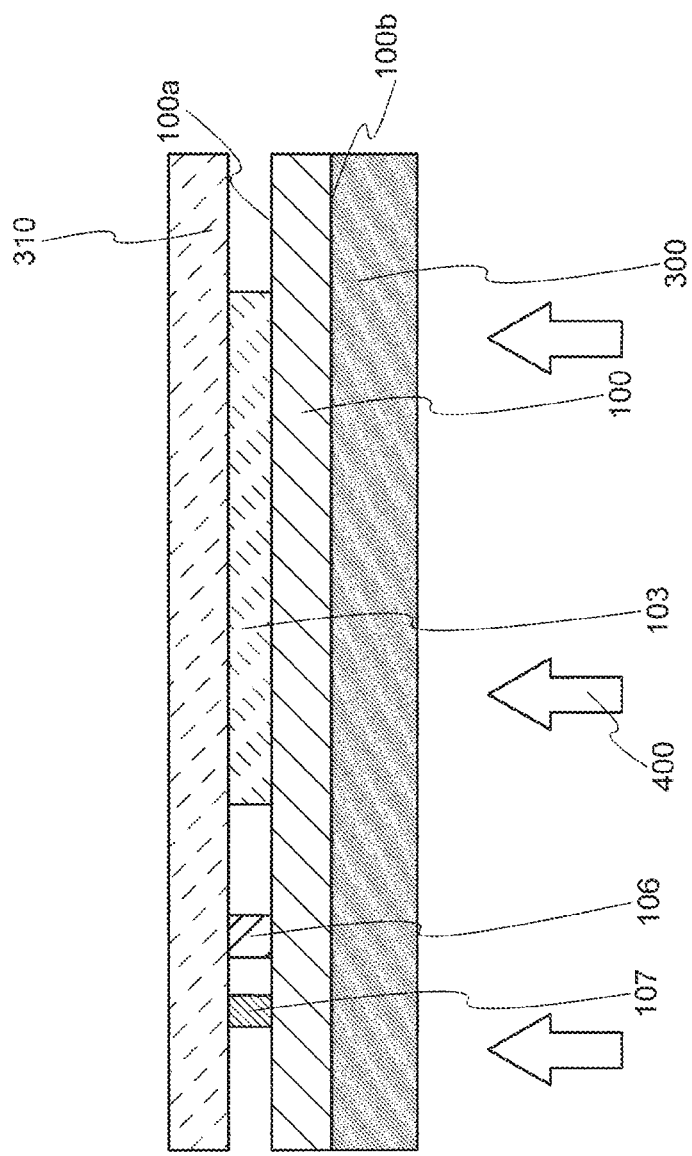
FIG. 8 is a cross-sectional view showing the method for manufacturing the display device in an embodiment according to the present invention.

Next, as shown in FIG. 8, a protective member 310 is formed on the display portion 103, the driving circuit 106 and the terminal electrode 107 on the first surface 100A of the substrate 100. There is no specific limitation on the material of the protective member 310. It is desired that the protective member 310 is formed of a light-transmissive material in order to allow the first markers 210 and the second markers 220 to be detected when the substrate 100 is to be cut as described below. The protective member 310 is formed of, for example, a film-like acrylic resin. There is no specific limitation on the method for forming the protective member 310. In this example, the protective member 310 is formed by a lamination method. The protective member 310 is not limited to being formed of an acrylic resin, and may be formed of an organic resin material such as a polycarbonate resin, an epoxy resin, a polyimide resin or the like.

Next, as shown in FIG. 8, a second surface 100b of the substrate 100 is irradiated with laser light 400. There is no specific limitation on the wavelength of the laser light 400. In the case where the substrate 100 is formed of an organic resin material such as polyimide or the like, the absorbance of the substrate 100 is maximum for light having a wavelength of 308 nm, which is in an ultraviolet range, and the substrate 100 does not absorb light having a wavelength longer than 350 nm.

When, for example, a polyimide substrate is irradiated with the laser light 400 having a wavelength of 308 nm, the polyimide substrate absorbs the light. A part of the polyimide is evaporated (sublimates) by the energy of the absorbed light. As a result, the glass substrate as the support member 300 is peeled off from the substrate 100. The above-described peeling method is referred to as an "LLO (Laser Lift-Off) method".

When the support member 300 is peeled off from the substrate 100 by the above-described peeling method, the substrate 100 may be expanded or shrunk by an inner stress of the substrate 100.

Figure 9:
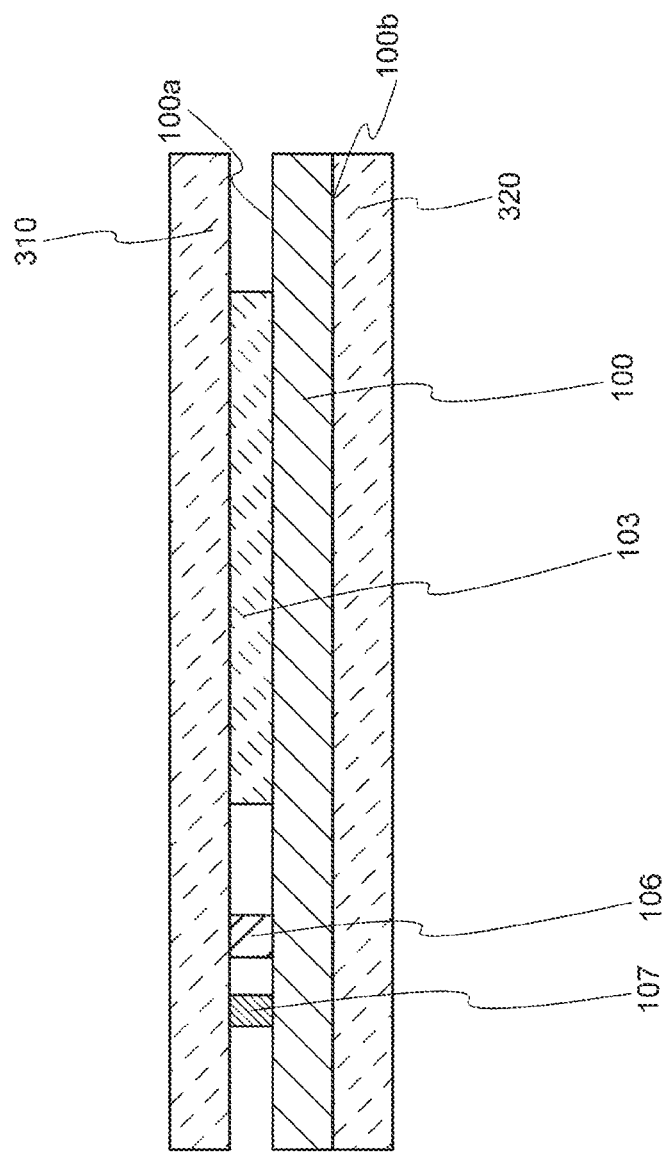
FIG. 9 is a cross-sectional view showing the method for manufacturing the display device in an embodiment according to the present invention.

Next, as shown in FIG. 9, the protective member 320 is formed on the second surface 100B of the substrate 100. There is no specific limitation on the material of the protective member 320. It is desired that the protective member 320 is formed of a light-transmissive material, like the protective member 310, in order to allow the first markers 210 and the second markers 220 to be detected when the substrate 100 is to be cut as described below. In this case, the protective member 320 may be formed of substantially the same material as that of the protective member 310, by substantially the same method as that of the protective member 310.

Figure 10:
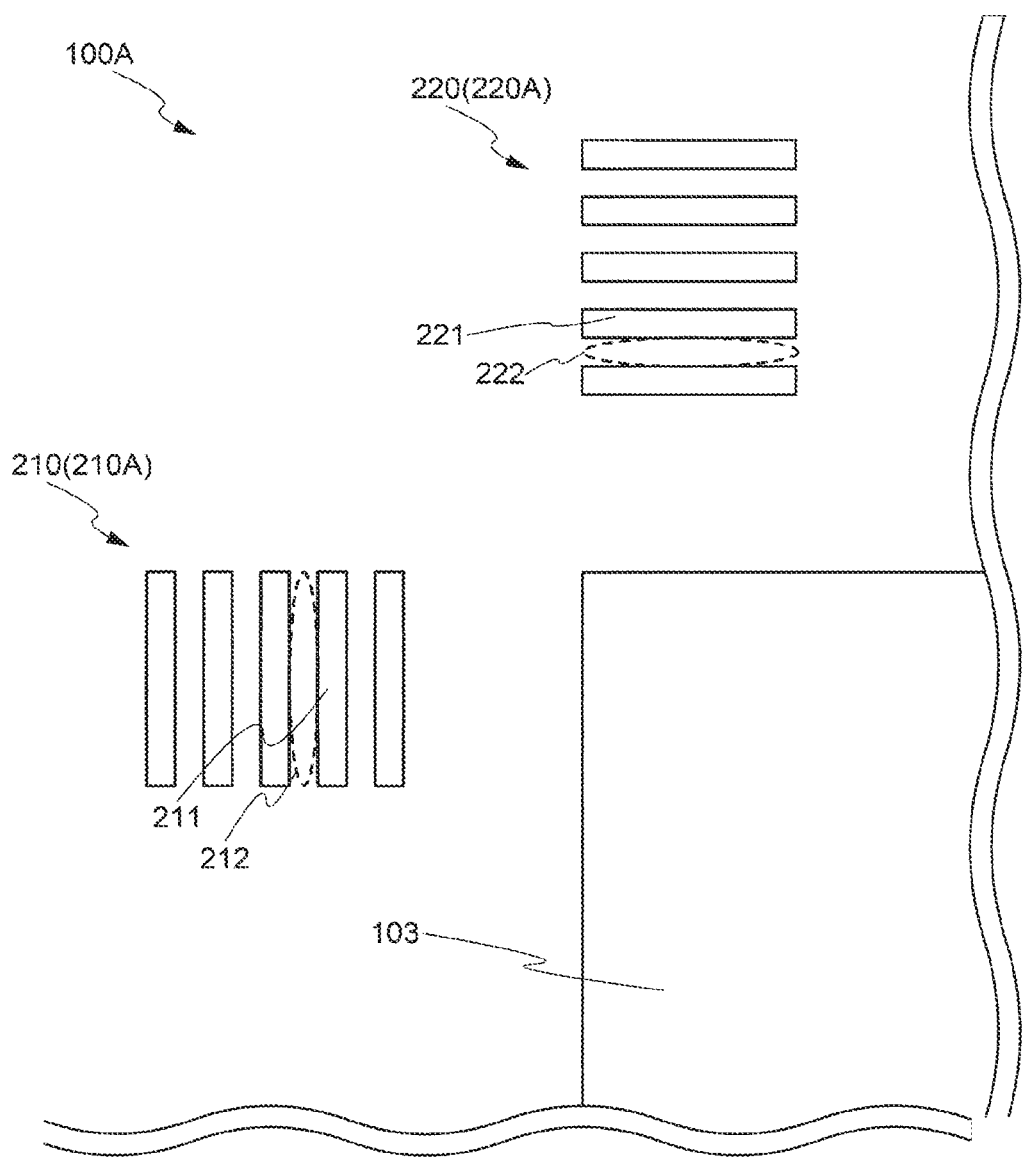
FIG. 10 is a plan view showing the method for manufacturing the display device in an embodiment according to the present invention.

Next, the substrate 100 is cut. FIG. 10 is an enlarged plan view of the upper left corner area 100A of the substrate 100 in a pre-cutting state.

In this example, the first marker 210 (first marker 210A) and the second marker 220 (second marker 220A) each include five lines (lines 211, lines 221) located at an equal interval while having spaces (spaces 212, spaces 222) between the lines. There is no specific limitation on the number of the lines. As the number of the lines is greater, changes in the positions of the first marker 210 and the second marker 220 are measured at a higher precision. Each of the first marker 210 and the second marker 220 may also be referred to as a "cutting position correction vernier".

Figure 11:
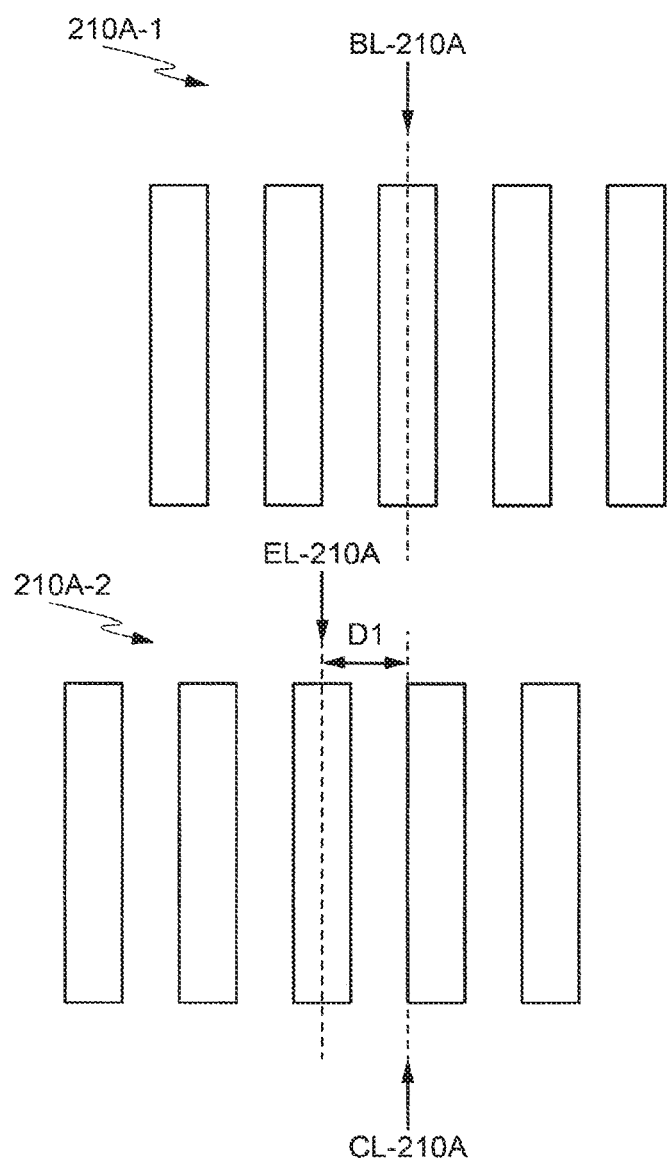
FIG. 11 is a plan view showing the method for manufacturing the display device in an embodiment according to the present invention.

The substrate 100 is specifically cut as follows (see FIG. 11). First, before the support member 300 is peeled off from the substrate 100, the center of the substrate 100 and the center of a measuring device are matched to each other. Next, coordinates of the center of the first marker 210A-1 (the first marker 210A before the support member 300 is peeled off from the substrate 100 is labeled as "210A-1") with respect to the center of the substrate 100 are acquired. A line running the center of the first marker 210A-1 is a line BL-210A. The line BL-210A is located at the same, or substantially the same, position as a design value. The line BL-210A may be referred to as a "first central line". Next, after the support member 300 is peeled off from the substrate 100 and the substrate 100 is expanded or shrunk as described above, the center of the substrate 100 and the center of the measuring device are matched to each other again. At this point, coordinates of the center of the first marker 210A-2 (the first marker 210A after the support member 300 is peeled off from the substrate 100 and the substrate 100 is expanded or shrunk is labeled as "210A-2") with respect to the center of the substrate 100 are acquired. A line running the center of the first marker 210A-2 is a line EL-210A. The line EL-210A may be referred to as a "second central line". A line that is offset from the line EL-210A by a difference D1 between the coordinates (position) of the line BL-210A and the coordinates (position) of the line EL-210A (the difference D1 may be referred to as a "first difference") is acquired as a cutting line CL-210A.

Next, the above-described process is performed on the first marker 210B in the lower left corner area 100B of the substrate 100. First, before the support member 300 is peeled off from the substrate 100, coordinates of the first central line of the first marker 210B are acquired. Next, after the support member 300 is peeled off from the substrate 100, coordinates of the second central line of the first marker 210B are acquired. Based on a difference between the coordinates of the first central line of the first marker 210B and the coordinates of the second central line of the first marker 210B (the difference may be referred to as a "second difference"), a cutting line CL-210B for the first marker 210B is acquired (see FIG. 13).

The cutting line CL-210A and the cutting line CL-210B may be regarded as points macroscopically. Therefore, a line connecting the cutting line CL-210A and the cutting line CL-210B (cutting line CL-L in FIG. 13) is used to cut the substrate 100, so that a left area extending in the longer axis direction of the substrate 100 is cut off. The cutting line CL-L may be a line connecting the center of the cutting line CL-210A and the cutting line CL-210B.

There is no specific limitation on the method for cutting the substrate 100. The substrate 100 may be cut by a cutter or the like, by laser processing or any other appropriate method.

Figure 12:
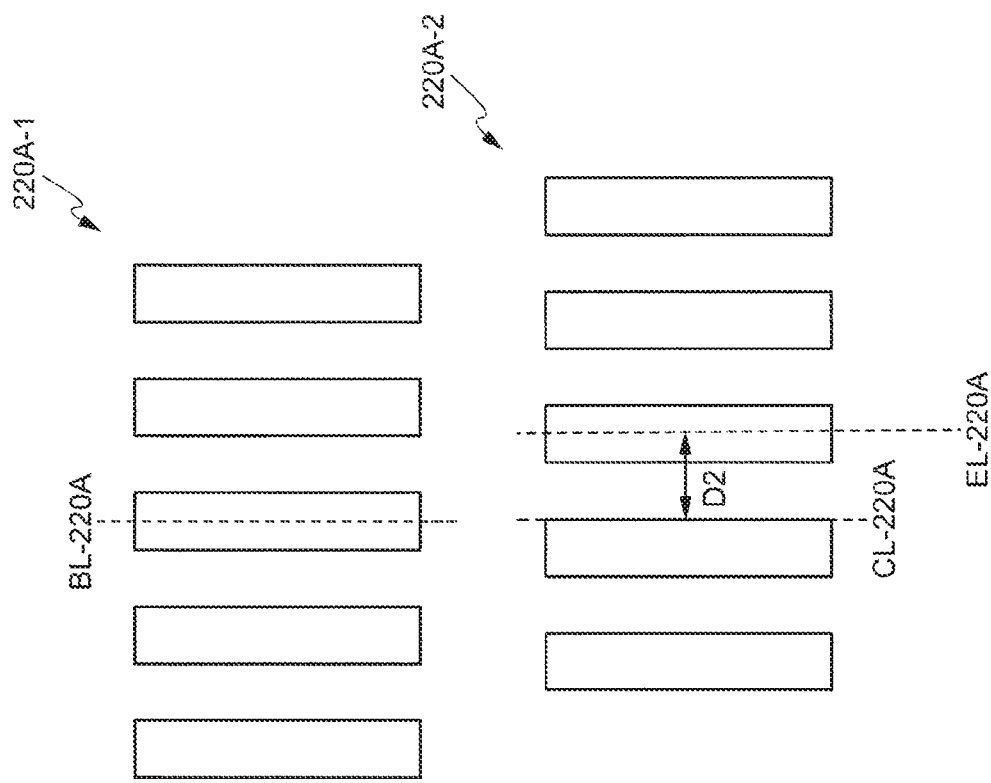
FIG. 12 is a plan view showing the method for manufacturing the display device in an embodiment according to the present invention.

An area extending in the shorter axis direction of the substrate 100 is cut off in substantially the same manner (see FIG. 12). First, before the support member 300 is peeled off from the substrate 100, the center of the substrate 100 and the center of the measuring device are matched to each other. Next, coordinates of the center of the second marker 220A-1 (the second marker 220A before the support member 300 is peeled off from the substrate 100 is labeled as "220A-1") with respect to the center of the substrate 100 are acquired. A line running the center of the second marker 220A-1 is a line BL-220A. The line BL-220A is located at the same, or substantially the same, position as a design value. Next, after the support member 300 is peeled off from the substrate 100 and the substrate 100 is expanded or shrunk as described above, the center of the substrate 100 and the center of the measuring device are matched to each other again. At this point, coordinates of the center of the second marker 220A-2 (the second marker 220A after the support member 300 is peeled off from the substrate 100 and the substrate 100 is expanded or shrunk is labeled as "220A-2") with respect to the center of the substrate 100 are acquired. A line running the center of the second marker 220A-2 is a line EL-220A. A line that is offset from the line EL-220A by a difference D2 between the coordinates (position) of the line BL-220A and the coordinates (position) of the line EL-220A is acquired as a cutting line CL-220A.

Next, the above-described process is performed on the second marker 220C in the upper right corner area 100C of the substrate 100. As a result, a cutting line CL-220C for the second marker 220C is acquired (see FIG. 13).

The cutting line CL-220A and the cutting line CL-220C may be regarded as points macroscopically. Therefore, a line connecting the cutting line CL-220A and the cutting line CL-220C (cutting line CL-U shown in FIG. 13) is used to cut the substrate 100, so that a top area extending in the shorter axis direction of the substrate 100 is cut off.

Figure 13:
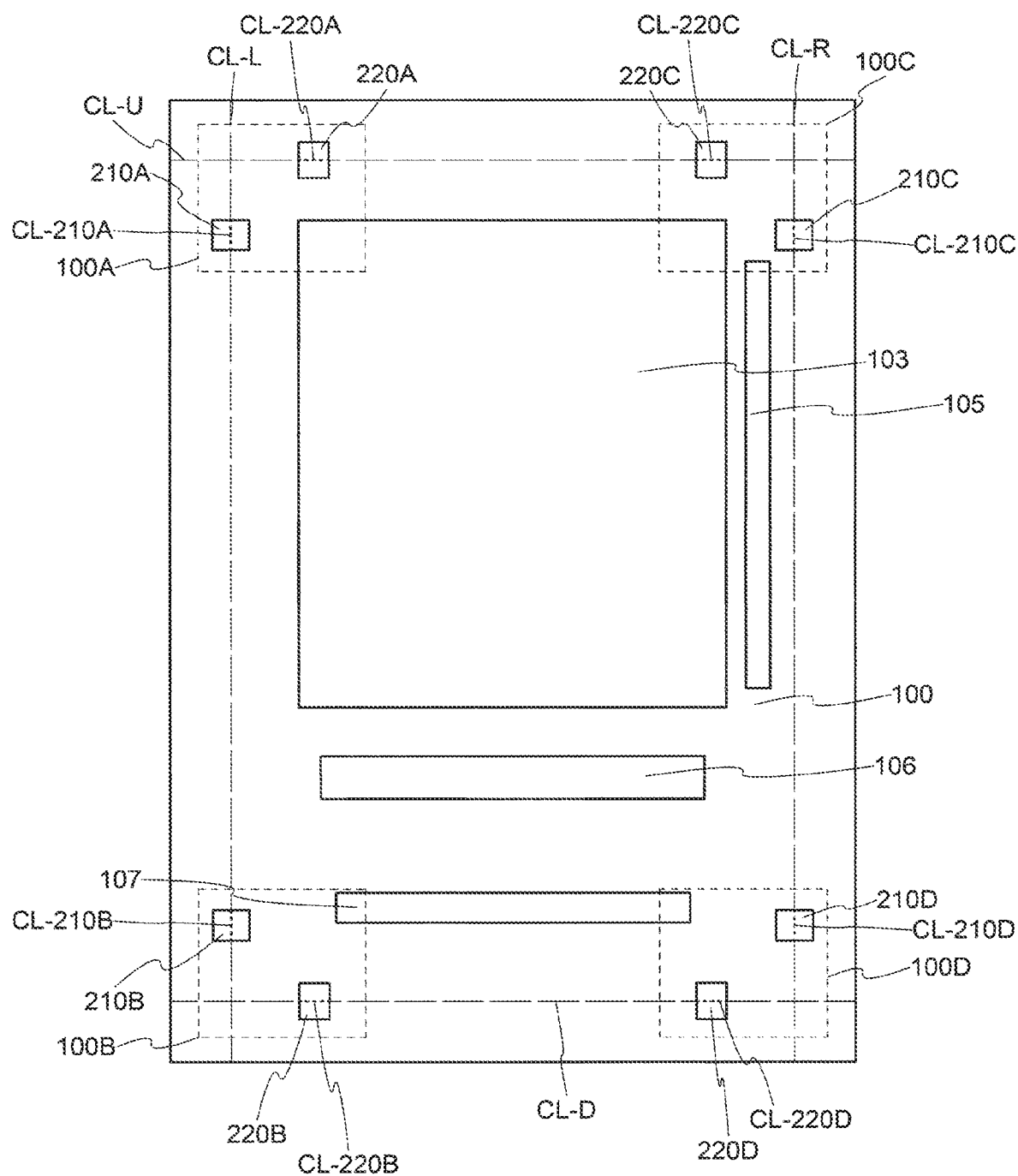
FIG. 13 is a plan view showing the method for manufacturing the display device in an embodiment according to the present invention.

FIG. 13 is a plan view after the cutting lines are acquired in the four corner areas 100A, 100B, 100C and 100D of the substrate 100. As shown in FIG. 13, a right cutting line CL-R of the substrate 100 is formed by connecting a cutting line CL-210C for the first marker 210C and a cutting line CL-210D for the first marker 210D.

A bottom cutting line CL-D of the substrate 100 is formed by connecting a cutting line CL-220B for the second marker 220B and a cutting line CL-220D for the second marker 220D.

Figure 14:
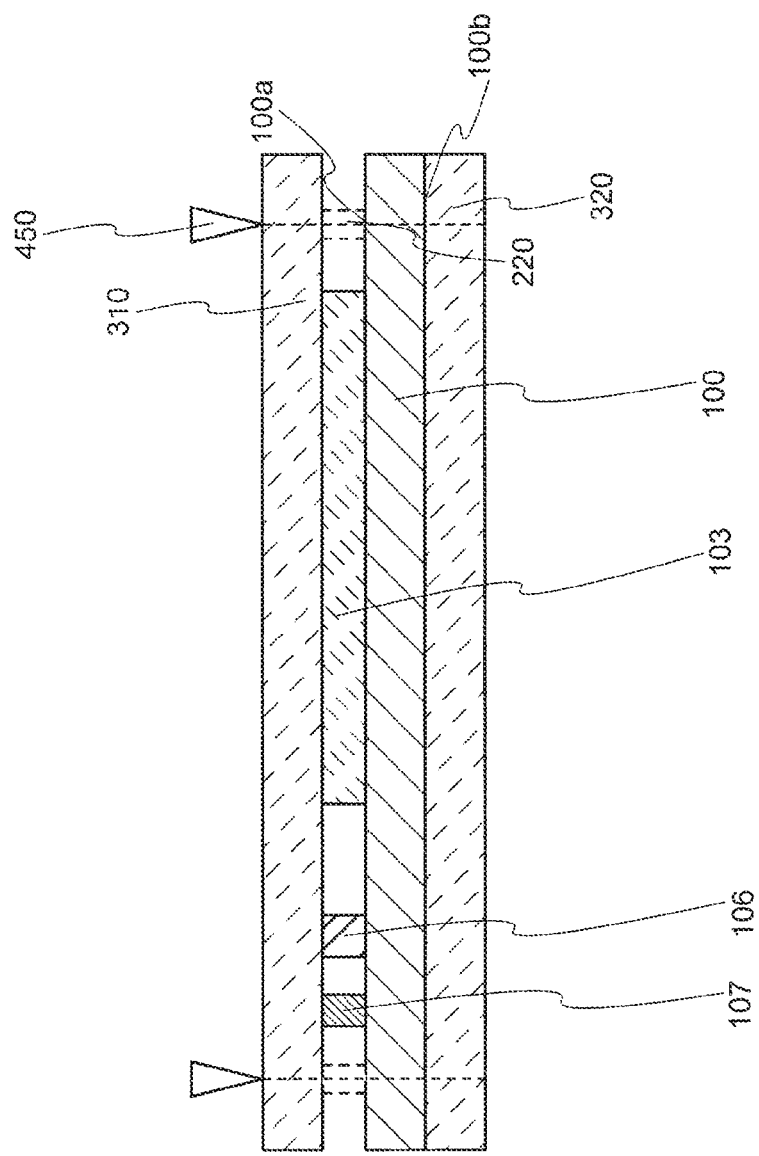
FIG. 14 is a cross-sectional view showing the method for manufacturing the display device in an embodiment according to the present invention.

As shown in FIG. 14, the substrate 100 is cut together with the protective member 310 and the protective member 320 along the above-described cutting lines by use of a cutting member 450. As a result, the display portion 103, the driving circuit 106, the terminal electrode 107 and the like formed on the substrate 100 are protected. The protective member 310 and the protective member 320 may each be appropriately replaced with another member or removed.

The first markers 210 and the second markers 220 after the substrate 100 is cut may have different shapes in the four corner areas 100A to 100D as shown in FIG. 3 and FIG. 4.

After the substrate 100 is cut, components such as the flexible printed circuit board 108 and the like are mounted and chamfering is performed as necessary, so that the display device 10 is manufactured.

With the above-described method, even if the substrate 100 is expanded or shrunk, the position at which the substrate 100 is cut is corrected at a high precision. Therefore, the post-cutting size (especially, the external size) of the substrate 100 is the same or proximate to a design value. For this reason, the display device 10 is manufactured stably without the positions at which the components are mounted being shifted in manufacturing steps after the substrate 100 is cut.

Embodiment 2

In embodiment 1, the first markers 210 and the second markers 220 are located in the four corner areas 100A to 100D of the substrate 100. The present invention is not limited to this. In this embodiment, a display device having a different positional arrangement of the first marker and the second marker will be described. Regarding the components and the materials described in embodiment 1, the descriptions may be incorporated by reference when necessary.

Figure 15:
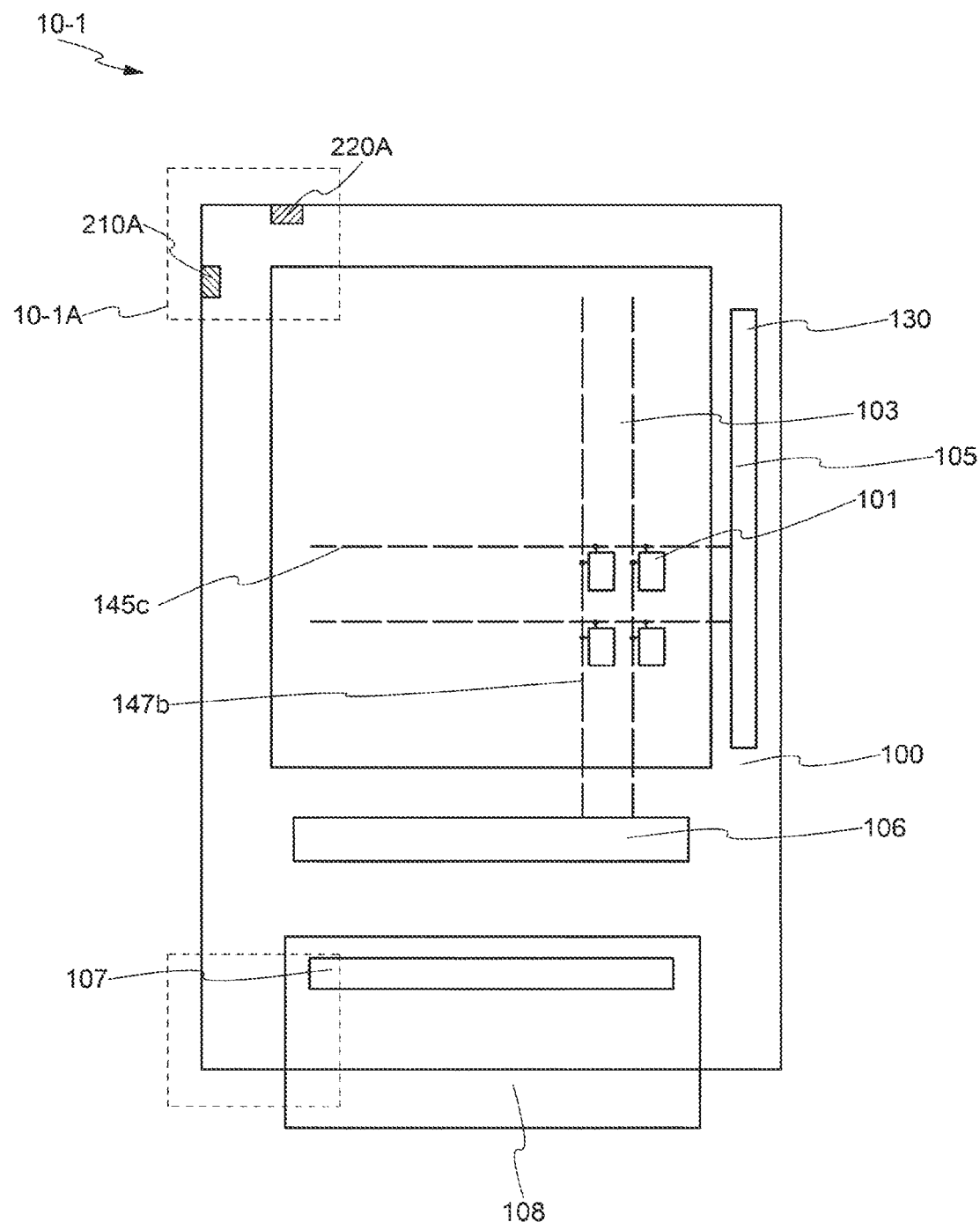
FIG. 15 is a plan view of a display device in an embodiment according to the present invention.

FIG. 15 is a plan view of a device 10-1. The display device 10-1 includes the substrate 100, the display portion 103, the driving circuit 105, the driving circuit 106, the terminal electrode 107, and the flexible printed circuit board 108. Unlike the display device 10, the display device 10-1 includes the first marker 210A and the second marker 220A only in an upper left corner area 10-1A.

Figure 16:
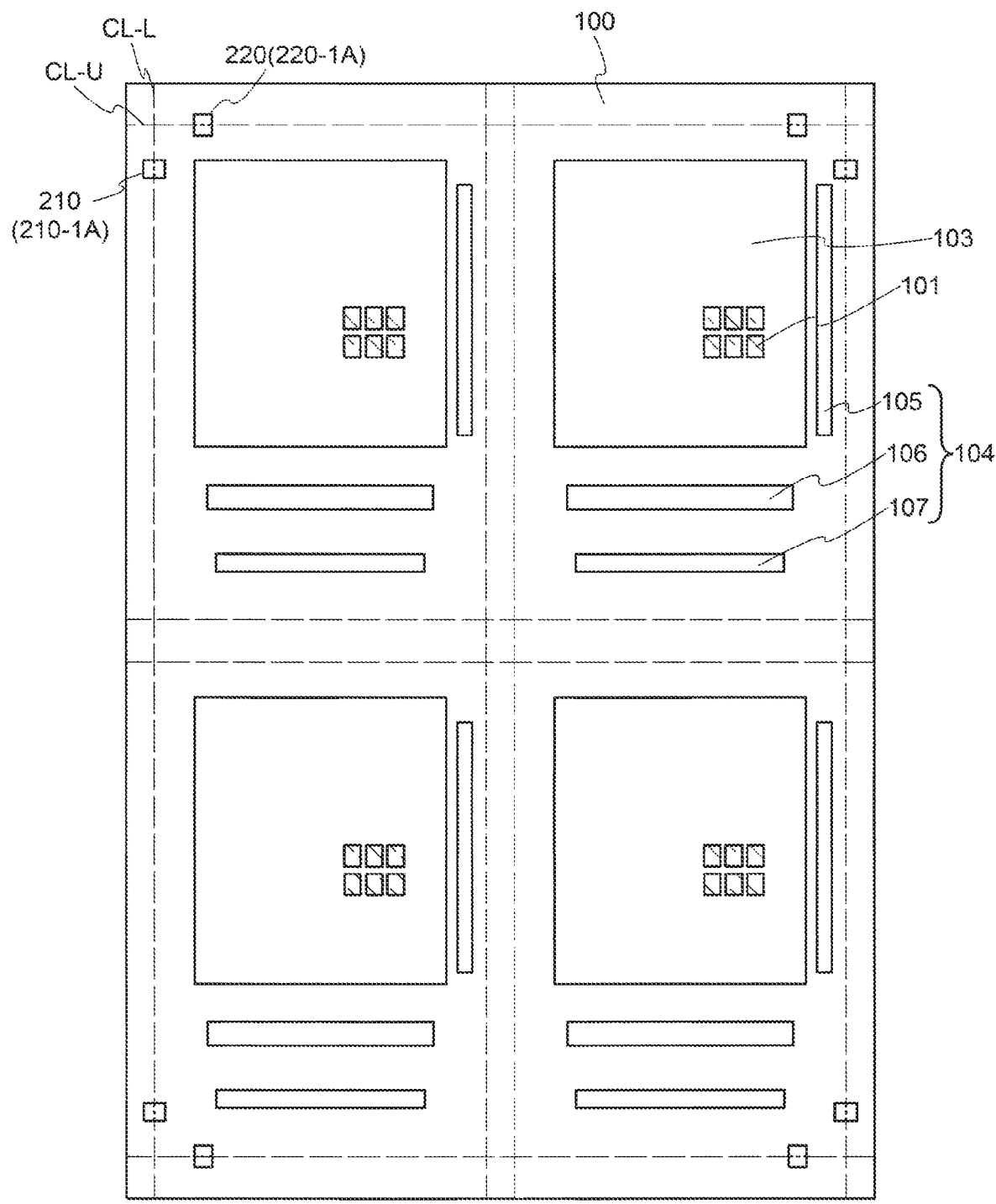
FIG. 16 is a plan view showing a method for manufacturing the display device in an embodiment according to the present invention.
Figure 17:
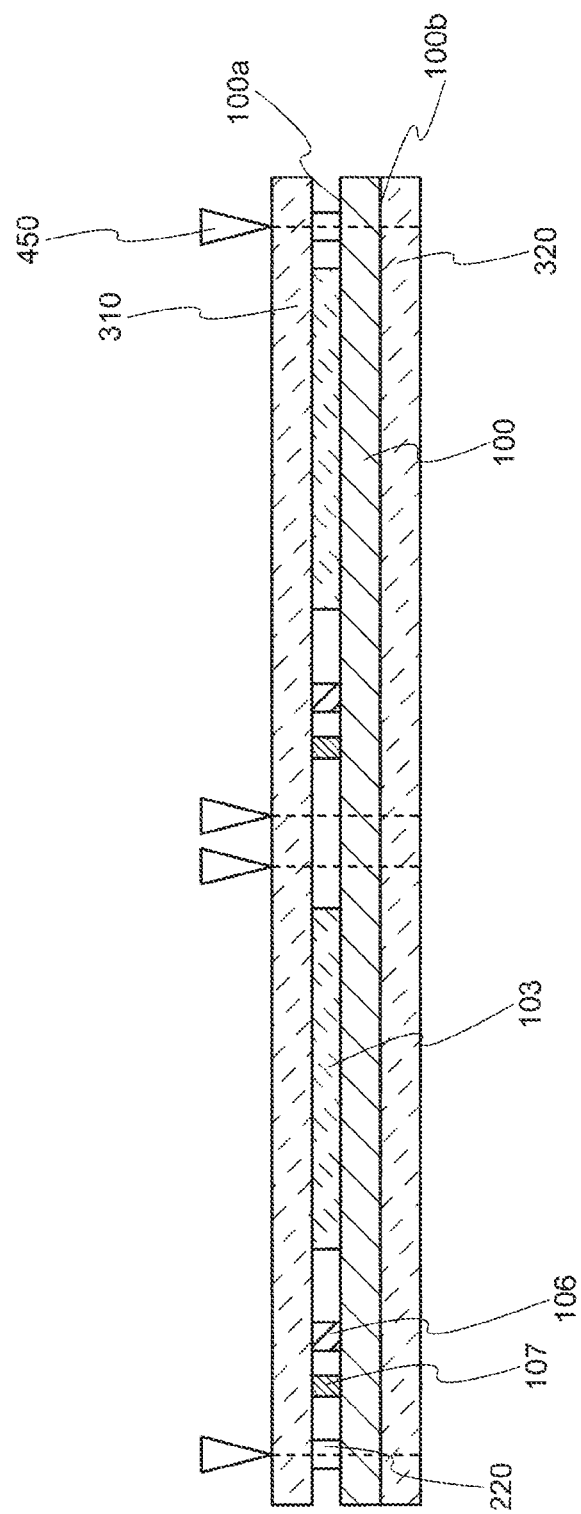
FIG. 17 is a cross-sectional view showing the method for manufacturing the display device in an embodiment according to the present invention.
Figure 18:
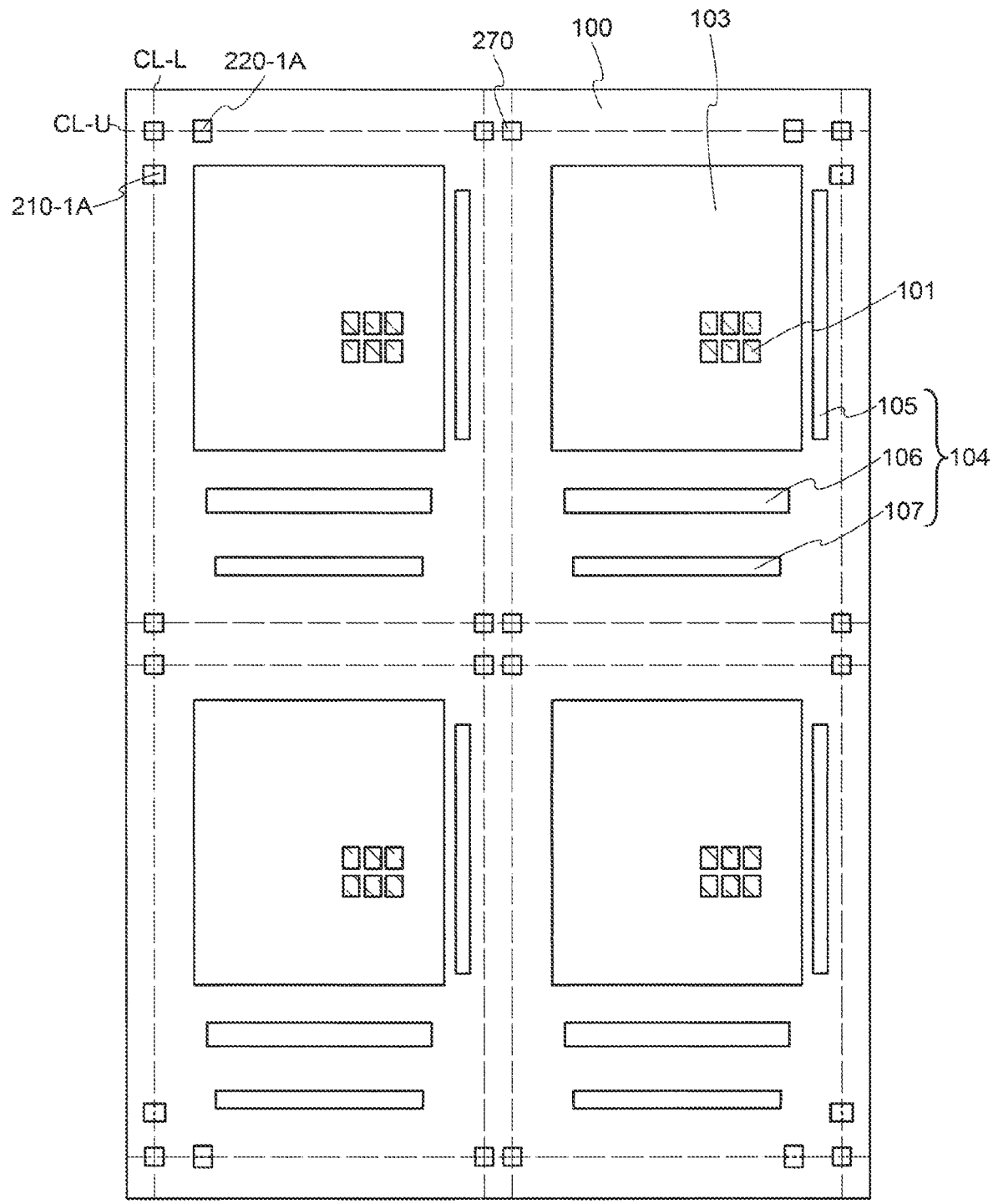
FIG. 18 is a plan view showing a method for manufacturing the display device in an embodiment according to the present invention.

As shown in FIG. 16, for manufacturing a plurality of the display devices 10-1, a plurality of the display portions 103, a plurality of the driving circuits 105, a plurality of the driving circuits 106, and a plurality of the terminal electrodes 107, which are components of the display devices 100, are formed on the substrate 100. In this case, the first marker 210 and the second marker 220 are formed at each of the four corner areas of the substrate 100. The cutting lines (e.g., the cutting lines CL-L and CL-U shown in FIG. 16) for the substrate 100 may be acquired by the method described in embodiment 1. In an area where neither first marker 210 nor the second marker 220 is provided, the substrate 100 may be cut along a cutting line provided by use of a design value (see FIG. 17). Alternatively, as shown in FIG. 18, cutting markers 270 may be located at positions corresponding to four corner areas of the display devices 10-1. In this case, the substrate 100 may be cut along lines running the center of the cutting lines 270.

In the case where a plurality of display devices are manufactured by use of a large substrate, the method in this embodiment is usable to decrease the variance in the external size of the display devices. The positions where the first marker(s) 210 and the second marker(s) 220 are to be located, and the number of the first marker(s) 210 and the second marker(s), may be appropriately changed in accordance with the degree of expansion or shrinkage of the substrate 100.

Embodiment 3

In embodiment 1, the first markers 210 and the second markers 220 are located in the four corner areas of the substrate 100 in order to correct the size of the substrate 100.

The present invention is not limited to this. In this embodiment, a display device including a chamfering marker in addition to the first markers 210 and the second markers 220 will be described. Regarding the components and the materials described in embodiment 1, the descriptions may be incorporated by reference when necessary. For the sake of convenience, a part of components may be omitted in the description.

Figure 19:
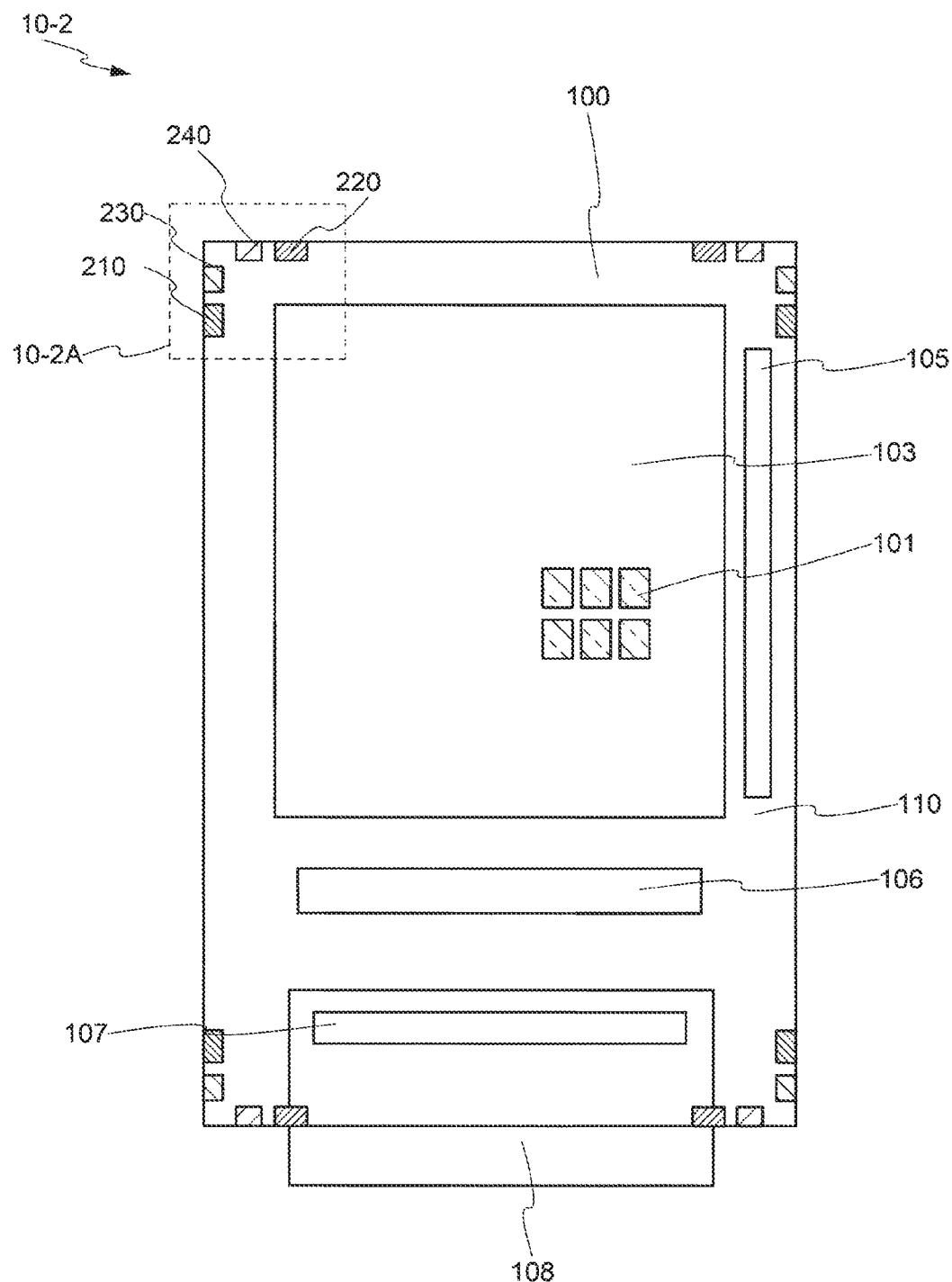
FIG. 19 is a plan view of a display device in an embodiment according to the present invention.

FIG. 19 is a plan view of a display device 10-2. The display device 10-2 includes the substrate 100, the display portion 103 (including the pixels 101), the driving circuit 105, the driving circuit 106, the terminal electrode 107, the flexible printed circuit board 108, the first markers 210, and the second markers 220. The display device 10-2 further includes third markers 230 and fourth markers 240.

Figure 20:
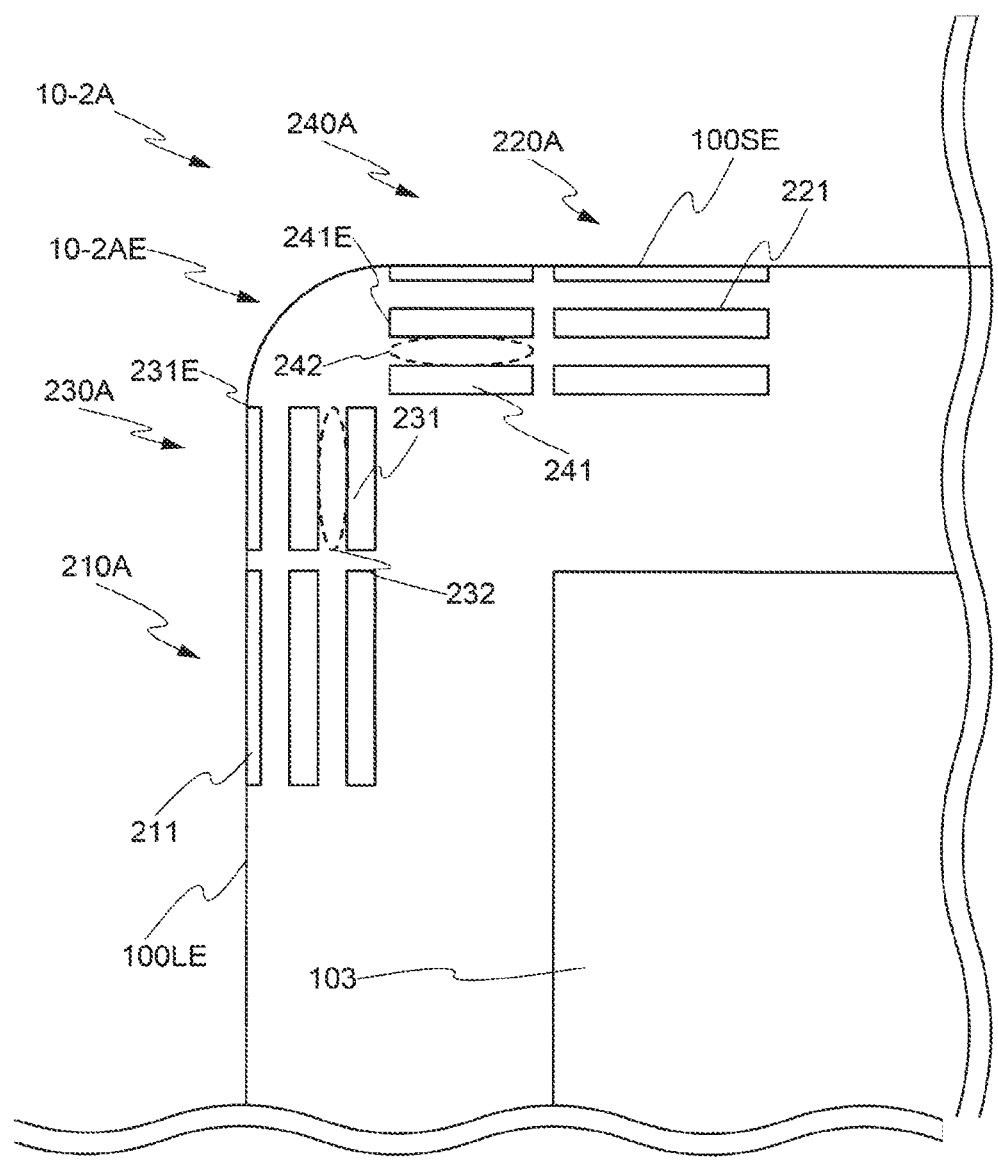
FIG. 20 is a partially enlarged plan view of the display device in an embodiment according to the present invention.

FIG. 20 is an enlarged plan view of an upper left corner area 10-2A among the four corner areas of the display device 10-2.

As shown in FIG. 20, in the upper left corner area 10-2A, a third marker 230A is located along the longer side of the substrate 100. The third marker 230A is located closer to an upper left edge 10-2AE than the first marker 210A. A fourth marker 240A is located along the shorter side of the substrate 100. The fourth marker 240A is located closer to the upper left edge 10-2AE than the second marker 220A.

Like the first marker 210A, the third marker 230A includes a plurality of lines 231 and spaces 232 provided between the plurality of lines 231. The third marker 230A is located in contact with the edge 100LE at the longer side of the substrate 100. The third marker 230A is located as extending in a longer axis direction.

The third markers 230 may have different shapes in the four corner areas of the substrate 100.

Like the second marker 220A, the fourth marker 240A includes a plurality of lines 241 and spaces 242 provided between the plurality of lines 241. The fourth marker 240A is located in contact with the edge 100SE at the shorter side of the substrate 100. The fourth marker 240A is located as extending in a shorter axis direction.

The fourth markers 240 may have different shapes in the four corner areas of the substrate 100.

An end 231E of the third marker 230A and an end 241E of the fourth marker 240A are each used as a start point or an end point in a chamfering step. Since the third markers 230 and the fourth markers 240 are provided, the positions at which the substrate 100 is to be chamfered are corrected in a state where the substrate 100 has been positionally corrected and cut by use of the first markers 210 and the second markers 220. Therefore, the variance in the external size of the post-chamfering display device is decreased.

Modification 1

In the above-described embodiments, the present invention is applied to an organic EL display device. The present invention is also applicable to another type of display device including a flexible substrate, specifically, a liquid crystal display device, another type of self-light emitting display device, an electronic paper display device including an electrophoretic display element or the like, and any other type of flat panel display device.

Modification 2

In the above-described embodiments, the first markers 210 and the second markers 220 are provided in the layer including the scanning lines 145c. The first markers 210 and the second markers 220 are not limited to this. For example, the first markers 210 and the second markers 220 may be located in a layer including the signal lines 147b. Alternatively, the first markers 210 and the second markers 220 may be located in a layer including the conductive layer 153 as long as the first markers 210 and the second markers 220 are detectable.

Modification 3

In embodiment 1, the protective member 320 is light-transmissive. The protective member 320 is not limited to this. In the case where there is no need to detect the first markers 210 or the second markers 220 from the second surface 100b of the substrate 100, the protective member 320 may be formed of a non-light transmissive material (e.g., metal material or the like).

Modification 4

In the above-described embodiments, a glass substrate is used as the support member 300. The support member 300 is not limited to this. The support member 300 may be formed of a metal material instead of glass.

A person of ordinary skill in the art would readily conceive various alterations or modifications of the present invention, and such alterations and modifications are construed as being encompassed in the scope of the present invention. For example, the display devices in the above-described embodiments may have an element added thereto, or deleted therefrom, or may be changed in design optionally by a person of ordinary skill in the art. The methods in the above-described embodiments may have a step added thereto, or deleted therefrom, or may be changed in the condition optionally by a person of ordinary skill in the art. Such devices and methods are encompassed in the scope of the present invention as long as including the gist of the present invention.

What is claimed is:

1. A display device, comprising:
    a substrate;
    a display portion located on the substrate, the display portion including a plurality of pixels;
    a first marker located in an end area that is along a longer side of the substrate and is in at least one of four corner areas of the substrate, the first marker extending in a longer axis direction of the substrate; and
    a second marker located in an end area that is along a shorter side of the substrate and is in the same corner area as that of the first marker, the second marker extending in a shorter axis direction of the substrate, wherein
    the first marker and the second marker each include a plurality of lines and a space provided between the plurality of lines, and
    in at least either the first marker or the second marker, one of the plurality of lines has a width different from a width of another line of the plurality of lines.

2. The display device according to claim 1, wherein the first marker and the second marker are provided in each of the four corner areas of the substrate.

3. The display device according to claim 2, wherein at least either the first markers or the second markers have different shapes in the four corner areas of the substrate.

4. The display device according to claim 1, further comprising:

a third marker located in an area that is along the longer side and is in each of the four corner areas of the substrate; and a fourth marker located an area that is along the shorter side and is in each of the four corner areas of the substrate.

5. The display device according to claim 1, wherein the first marker and the second marker are located in a layer including any of lines included in the display portion.

6. The display device according to claim 1, wherein the substrate is a flexible substrate.

7. The display device according to claim 1, wherein the pixels each include an organic EL element.

* * * * *